(12) United States Patent
Bocock et al.

(10) Patent No.: US 7,173,491 B2
(45) Date of Patent: Feb. 6, 2007

(54) FAST SETTLING POWER AMPLIFIER REGULATOR

(75) Inventors: Ryan M. Bocock, Austin, TX (US); Timothy J. Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/814,617

(22) Filed: Mar. 31, 2004

(65) Prior Publication Data

US 2005/0024145 A1    Feb. 3, 2005

Related U.S. Application Data

(63) Continuation of application No. 10/308,765, filed on Dec. 3, 2002, now Pat. No. 6,894,565.

(51) Int. Cl.
 *H03G 3/30* (2006.01)
(52) U.S. Cl. .................. 330/285; 330/296; 330/297
(58) Field of Classification Search ............... 330/127, 330/129, 207 P, 279, 285, 296, 297
 See application file for complete search history.

(56) References Cited

U.S. PATENT DOCUMENTS

| | | | |
|---|---|---|---|
| 3,900,823 A | 8/1975 | Sokal et al. | |
| 4,021,751 A | 5/1977 | Suzuki | |
| 4,075,574 A | 2/1978 | Gilbert | |
| 4,165,493 A | 8/1979 | Harrington | |
| 4,590,436 A | 5/1986 | Butler et al. | |
| 4,604,532 A | 8/1986 | Gilbert | |
| 4,649,467 A | 3/1987 | Vesce et al. | |
| 4,772,856 A | 9/1988 | Nojima et al. | |
| 4,808,907 A | 2/1989 | Main | |
| 4,857,865 A | 8/1989 | Berman et al. | |
| 4,893,030 A | 1/1990 | Shearer et al. | |
| 4,990,803 A | 2/1991 | Gilbert | |
| 5,023,566 A | 6/1991 | El-Hamamsy et al. | |
| 5,118,997 A | 6/1992 | El-Hamamsy et al. | |
| 5,274,341 A | 12/1993 | Sekine et al. | |
| 5,291,123 A | 3/1994 | Brown | |
| 5,298,811 A | 3/1994 | Gilbert | |
| 5,327,337 A | 7/1994 | Cripe | |

(Continued)

FOREIGN PATENT DOCUMENTS

DE    4419318    7/1995

(Continued)

OTHER PUBLICATIONS

Sokal, N. O. and Sokal, A. D., "Class E—A new class of high-efficiency tuned single ended switching power amplifiers," IEEE Journal of Solid State Circuits, vol. SC-10, No. 3, Jun. 1975, pp. 168-176.

(Continued)

*Primary Examiner*—Khanh Van Nguyen
(74) *Attorney, Agent, or Firm*—Johnson & Associates (57) ABSTRACT

A method and apparatus is provided for dynamically changing the biasing conditions of a voltage regulator to overcome the problems caused by various conditions. The invention includes a detector and a bias control circuit for applying bias current to the voltage regulator to compensate for a detected condition.

22 Claims, 5 Drawing Sheets

U.S. PATENT DOCUMENTS

| | | |
|---|---|---|
| 5,343,162 A | 8/1994 | Davis |
| 5,345,185 A | 9/1994 | Gilbert |
| 5,420,537 A | 5/1995 | Weedon et al. |
| 5,434,537 A | 7/1995 | Kukkonen |
| 5,450,036 A | 9/1995 | Nishioka et al. |
| 5,477,188 A | 12/1995 | Chawla et al. |
| 5,497,125 A | 3/1996 | Royds |
| 5,604,383 A | 2/1997 | Matsuzaki |
| 5,612,647 A | 3/1997 | Malec |
| 5,623,231 A | 4/1997 | Mohwinkel et al. |
| 5,625,205 A | 4/1997 | Kusama |
| 5,635,872 A * | 6/1997 | Zimmerman ................ 330/285 |
| 5,646,578 A | 7/1997 | Loh et al. |
| 5,648,743 A | 7/1997 | Nagaya et al. |
| 5,726,603 A | 3/1998 | Chawla et al. |
| 5,742,205 A | 4/1998 | Cowen et al. |
| 5,789,984 A | 8/1998 | Davis et al. |
| 5,831,331 A | 11/1998 | Lee |
| 5,834,978 A * | 11/1998 | Cho ........................... 330/298 |
| 5,867,061 A | 2/1999 | Rabjohn et al. |
| 5,880,635 A | 3/1999 | Satoh |
| 5,942,946 A | 8/1999 | Su et al. |
| 5,955,926 A | 9/1999 | Uda et al. |
| 5,969,582 A | 10/1999 | Boesch et al. |
| 5,973,368 A | 10/1999 | Pearce et al. |
| 5,974,041 A | 10/1999 | Kornfeld et al. |
| 5,986,500 A | 11/1999 | Park et al. |
| 6,008,698 A | 12/1999 | Dacus et al. |
| 6,011,438 A | 1/2000 | Kakuta et al. |
| 6,016,075 A | 1/2000 | Hamo |
| 6,047,167 A | 4/2000 | Yamashita |
| 6,047,168 A | 4/2000 | Carlsson |
| 6,069,528 A | 5/2000 | Kashima |
| 6,075,995 A | 6/2000 | Jensen |
| 6,133,793 A | 10/2000 | Lau et al. |
| 6,137,273 A | 10/2000 | Bales et al. |
| 6,147,511 A | 11/2000 | Patel et al. |
| 6,157,258 A | 12/2000 | Adishian et al. |
| 6,167,134 A | 12/2000 | Scott et al. |
| 6,181,207 B1 | 1/2001 | Chevallier et al. |
| 6,198,347 B1 | 3/2001 | Sander et al. |
| 6,203,516 B1 | 3/2001 | Kepley |
| 6,208,549 B1 | 3/2001 | Rao et al. |
| 6,208,875 B1 | 3/2001 | Damgaard et al. |
| 6,222,788 B1 | 4/2001 | Forbes et al. |
| 6,232,634 B1 | 5/2001 | Wu et al. |
| 6,236,271 B1 | 5/2001 | Vakilian |
| 6,265,939 B1 | 7/2001 | Wan et al. |
| 6,274,937 B1 | 8/2001 | Ahn et al. |
| 6,319,829 B1 | 11/2001 | Pasco et al. |
| 6,323,735 B1 | 11/2001 | Welland et al. |
| 6,362,606 B1 | 3/2002 | Dupuis et al. |
| 6,384,540 B1 | 5/2002 | Porter, Jr. et al. |
| 6,392,488 B1 | 5/2002 | Dupuis et al. |
| 6,407,639 B1 | 6/2002 | Jean et al. |
| 6,448,847 B1 | 9/2002 | Paul et al. |
| 6,462,620 B1 | 10/2002 | Dupuis et al. |
| 6,492,872 B1 | 12/2002 | Fujioka et al. |
| 6,549,071 B1 | 4/2003 | Paul et al. |
| 6,566,944 B1 | 5/2003 | Pehlke et al. |
| 6,614,309 B1 | 9/2003 | Pehlke |
| 6,646,511 B2 * | 11/2003 | Canyon et al. ............. 330/285 |
| 6,653,902 B1 | 11/2003 | Bachhuber et al. |
| 6,677,821 B2 | 1/2004 | Kusunoki et al. |
| 6,828,859 B2 | 12/2004 | Dupuis |
| 2002/0044018 A1 | 4/2002 | Dupuis et al. |

FOREIGN PATENT DOCUMENTS

| | | |
|---|---|---|
| EP | 399561 | 11/1990 |
| EP | 0413348 A2 | 2/1991 |
| EP | 0654898 A2 | 5/1995 |
| JP | 03128513 A | 5/1991 |
| JP | 63-7011 | 1/1998 |
| JP | 200074559 | 6/2000 |
| WO | WO 98/37627 | 8/1998 |
| WO | WO 00/16492 | 3/2000 |

OTHER PUBLICATIONS

Makihara, Chihiro et al., "The Possibility of High Frequency Functional Ceramics Substrate", International Smposium on Multilayer Electronic Ceramic Devices, May 5, 1998 in Cincinati, Ohio.

Huange et al., "A BiCMOS /Automatic Gain Control Amplifier for SONET OC-3", Proceeding of the IEEE Custom IC Conference, May 1-4, 1995, pp. 103-106.

Webster, "Websters Ninth New Collegiate Dictionary", Merriam-Webster, 1991, p. 971.

Toffolo et al., "Development of a CMOS switched capacitor instrumentation amplifier", IEEE Colloquium on ASICS, Apr. 10, 1992 pp. 2/1.

G. Trauth V. Vanhuffel J. Trichet, "An Advanced Controller for Multi-Band Open Loop Power Control Mode RF Power Amplifier", Microwave Engineering, Jul. 2002, pp. 39-40.

RF Micro Devices, Inc., RF3110 Triple-Band GSM/DCS/PCS Power Amp Module Data Sheet, pp. 2-401-2-412.

Berglund, "A Note on Power-Law Devices and Their Effect on Signal-to-Noise Ratio", IEEE Transactions on Information Theory, vol. 10, Issue 1, Jan. 1964, pp. 52-57.

* cited by examiner

FAST SETTLING POWER AMPLIFIER REGULATOR

CROSS REFERENCE TO RELATED APPLICATIONS

This application is a continuation of commonly owned U.S. patent application Ser. No. 10/308,765, filed on Dec. 3, 2002 now U.S. Pat. No. 6,894,565, entitled "FAST SETTLING POWER AMPLIFIER REGULATOR."

FIELD OF THE INVENTION

This invention relates to the field of power amplifiers. In particular, this invention is drawn to techniques for dynamically biasing a regulator for a power amplifier.

BACKGROUND OF THE INVENTION

In some applications utilizing power amplifiers, there is a need to vary the output power delivered to a load. For example, in a cell phone environment, it is desired to vary the output power of the cell phone based on various factors. For example, a base station may dictate the power level at which each cell phone should transmit (based on factors such as the physical distance from the base station, for example). A standard method of controlling the output power of a power amplifier is to use a voltage regulator to regulate the battery or power supply voltage.

Figure 1:
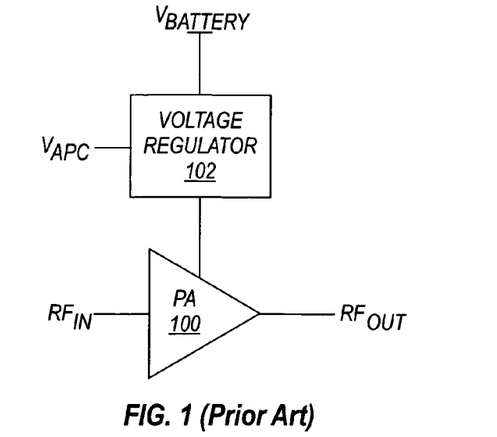
FIGS. 1–3 illustrate prior art voltage regulators for providing a regulated supply voltage to a power amplifier.

FIG. 1 is an example of an RF power amplifier 100 regulated by a voltage regulator 102. The power amplifier 100 receives an RF input signal ($RF_{IN}$) and amplifies the signal to generate an RF output signal ($RF_{OUT}$). The voltage regulator 102 is connected between the power amplifier 100 and a supply voltage ($V_{BATTERY}$) and provides a regulated voltage to the power amplifier 100. The voltage regulator 102 receives a power control signal ($V_{APC}$) which relates to a desired output power level.

Figure 2:
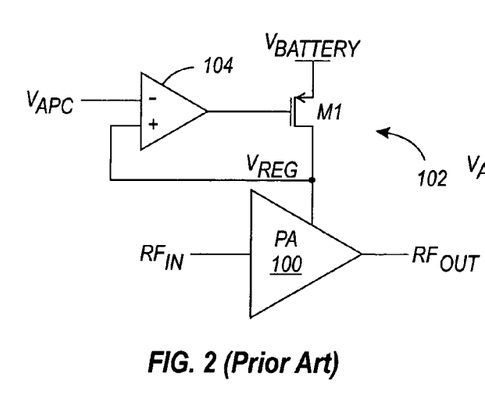
Figure 3:
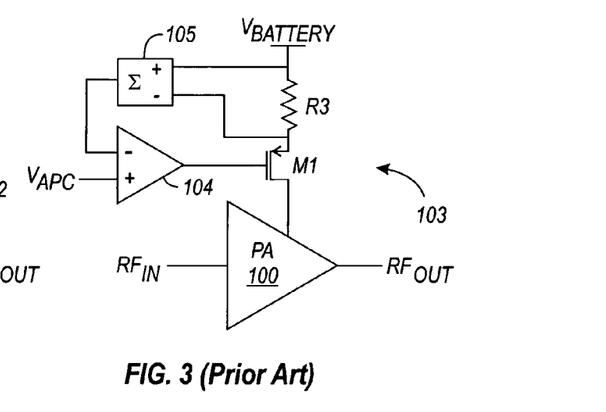

FIG. 2 illustrates an example of a prior art power control circuit for regulating a supply voltage using an op-amp feedback circuit. FIG. 2 shows a voltage regulator 102 connected between a voltage supply and a power amplifier 100. The voltage regulator 102 is comprised of a switching device M1 and an op-amp 104, which form a feedback circuit. Since the power amplifier 100 requires high DC current to be drawn from the supply voltage, the switching device M1 will be large and will have a large gate capacitance. It is standard practice in the prior art to compensate the op-amp with the gate capacitance of switching device M1. FIG. 3 illustrates an example of a prior art power control circuit using a current regulator. FIG. 3 shows a current regulator 103 connected between a voltage supply and a power amplifier 100. The current regulator 103 is comprised of switching device M1, an op-amp 104, summer 105, and resister R3. The circuit develops a voltage across the resistor R3 that is proportional to the DC current supplied to the power amplifier 100, which is provided as an input to the op-amp 104.

Figure 4:
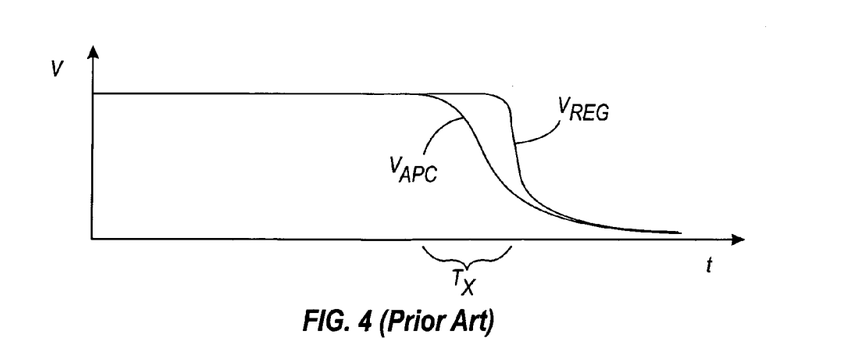
FIG. 4 is a plot illustrating a desired voltage regulator output waveform and an actual voltage regulator output waveform of the prior art.

One problem with a prior art power control circuit, such as the circuit shown in FIG. 2, is that switching device M1 saturates at high power levels, especially when the battery is low. When the switching device M1 saturates, the voltage between the source and drain of the switching device M1 and the loop gain of the feedback loop goes to zero. The unity gain frequency of the feedback loop also goes to zero. When the unity gain frequency of the feedback loop goes to zero, the waveform illustrated in FIG. 4 is observed. FIG. 4 illustrates the voltage regulator output, $V_{REG}$ (at the output of voltage regulator 102), versus time. $T_X$ represents the delay from a desired waveform $V_{APC}$ (at the output of voltage regulator 102) which is introduced to $V_{REG}$ by regulator 102 when M1 saturates. The switching power envelope at the output of power amplifier 100 that corresponds to waveform $V_{REG}$ may violate the switching transient specification for an industry standard (e.g., a GSM TDMA standard). Therefore, there is a need to solve the problems described above.

SUMMARY OF THE INVENTION

A circuit is provided for regulating the output power of a power amplifier during a switching transient comprising: a detector circuit coupled to a regulator and to a control signal that is generated to control the output power of the power amplifier, wherein the detector circuit detects switching transients of the power amplifier; and a circuit coupled to the regulator for applying a signal to decrease the settling time of the regulator during a detected switching transient.

One embodiment includes a circuit for regulating the output power of a power amplifier during a switching transient comprising: a regulator; a detector for detecting a condition relating to the operation of the regulator; and control circuitry coupled to the regulator for decreasing the settling time of regulator in response to a detected condition.

Another embodiment provides a method of controlling a regulator comprising the steps of: detecting a condition relating to the operation of the regulator; and in response to a detected condition, applying a signal to decrease the settling time of the regulator.

Another embodiment provides a method of controlling a regulator used with a power amplifier comprising the steps of: providing a first and second regulators; using the first regulator to provide power to the power amplifier; detecting a condition relating to the operation of the regulators; in response to a detected condition, using any combination of the first and second regulators to provide power to the power amplifier.

Another embodiment provides a method of controlling a regulator for a power amplifier comprising the steps of: providing a regulator; providing current to the regulator to power the power amplifier; and selectively applying a signal to the regulator to control the settling time of the regulator.

Another embodiment provides a circuit for regulating the output power of a power amplifier during a switching transient comprising: a regulator; a detector for detecting a condition relating to a power amplifier control signal; and control circuitry coupled to the regulator for decreasing its settling time in response to a detected condition.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The present invention may be used with wireless transmission systems, such as with a power amplifier for a cellular telephone or other device. The invention may also be applied to other types of power amplifiers or circuits that require a regulated voltage supply.

As mentioned above, when using a power control circuit such as that shown in FIG. 2, the switching device M1 may saturate at high power levels, causing the problems described. One solution is to apply high bias current to the op-amp 104. This results in a high gain and thus requires less voltage across the drain and source of the switching device M1 for a given unity gain frequency. While this solution works, it results in the op-amp 104 burning too much power and decreasing battery life. Described below are additional solutions that overcome these problems without significantly increasing power consumption.

In general, the present invention provides techniques for dynamically changing the biasing conditions of a regulator to overcome the problems caused by various conditions, such as those described above. The invention is capable of decreasing the delay in the regulator performance by decreasing the settling time of the regulator. In one example, the invention includes a detector for detecting one or more conditions relating to encountered problems. A bias control circuit is coupled to the detector for applying a signal to the voltage regulator to compensate for the detected condition. A timer may be used to control the duration at which the bias current is applied. Following are examples of the present invention, although many more embodiments are possible with the spirit and scope of the invention.

Figure 5:
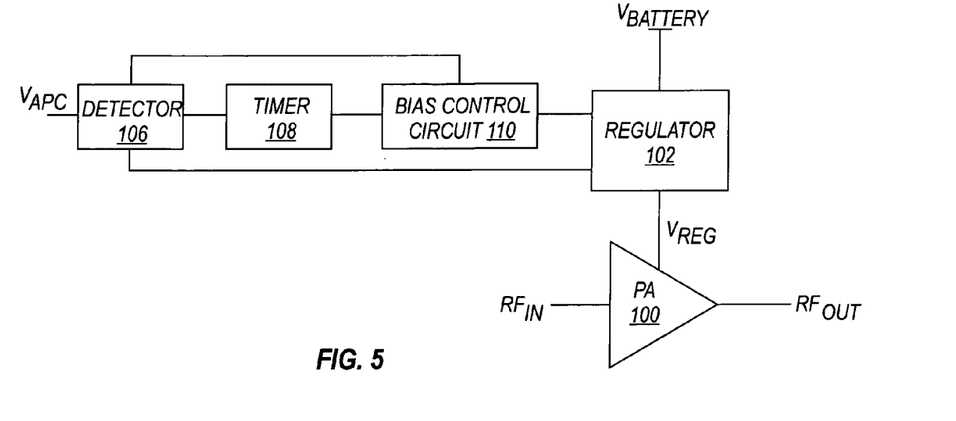
FIG. 5 is a block diagram of a power amplifier having a dynamically biased regulator.
Figure 6:
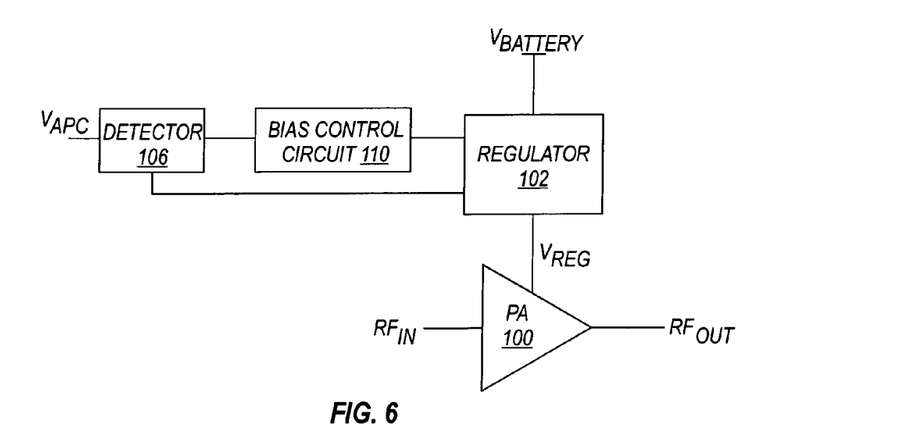
FIG. 6 is a block diagram of another power amplifier having a dynamically biased regulator.

FIGS. 5 and 6 are block diagrams of a power amplifier having a dynamically biased regulator. The regulators may be any desired type of regulator (e.g., voltage regulators, current regulators, etc.). FIG. 5 shows a regulator 102 coupled between a voltage supply ($V_{BATTERY}$) and an RF power amplifier 100. Note that while the figures illustrate an RF power amplifier, the present invention may be used with other types of amplifiers or circuits. Also, while the voltage supply is shown as a battery, other types of voltage supplies may be used. A detector 106 is connected to an amplifier power control signal $V_{APC}$. The detector 106 is used to detect one or more conditions relating to problems such as those described above. For example, the detector 106 may be used to detect the power amplifier switching time. In another example, the detector 106 may be used to detect the desired output power level. In another example, the detector 106 may be used to detect when the input voltage provided to the regulator is less than the supply voltage. In another example, the detector 106 may be used to detect when the power amplifier 100 is requesting maximum power. In another example, the detector 106 may be used to detect when regulator 102 is saturated. When a condition is detected, the timer 108 is triggered, which controls the duration in which bias current is applied. In another example, the detector 106 controls the duration in which bias current is applied. The timer 108 is connected to the bias control circuit 110. The bias control circuit 110 is coupled to the regulator 102 and applies bias current to the regulator 102 in response to the detected condition.

FIG. 6 is a block diagram of a power amplifier having a dynamically biased regulator. Like FIG. 5, FIG. 6 shows a regulator 102, power amplifier 100, detector 106, and a bias control circuit 110. However, FIG. 6 shows an example of a dynamically biased regulator without the timer 108 shown in FIG. 5. In this example, the bias control circuit 110 may change the bias conditions of the regulator during the time which a condition is detected.

Figure 7:
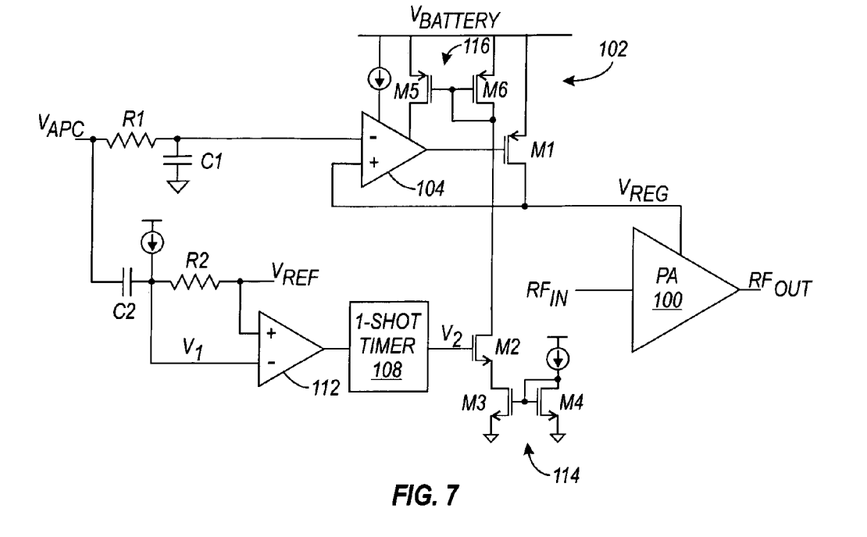
FIG. 7 is a schematic diagram of one example of a power amplifier having a dynamically biased voltage regulator.

FIG. 7 is a schematic diagram of one example of a power amplifier having a dynamically biased voltage regulator. In the example shown in FIG. 7, the bias control circuit dynamically biases an op-amp during the switching time of the power amplifier. In this example, the bias current is increased while the power amplifier turns off.

FIG. 7 shows a power amplifier 100 coupled to a voltage regulator 102. The voltage regulator 102 is coupled between the power amplifier 100 and a voltage supply $V_{BATTERY}$ and includes a switching device M1 and a feedback loop formed by the switching device M1 and an op-amp 104. A power control signal $V_{APC}$ is connected to a low pass filter formed by resistor R1 and capacitor C1. The filtered power control signal is connected to one input of the op-amp 104. The unfiltered power control signal $V_{APC}$ is provided to a detector formed by capacitor C2, resistor R2, and comparitor 112. The sizes of capacitor C2 and resistor R2 are chosen so that they have a slow time constant. A DC current source is also connected to capacitor C2 and resistor R2. The inputs of the comparitor 112 are connected to opposite terminals of the resistor R2, as well as to an arbitrary reference voltage $V_{REF}$. When the voltage of the power control signal $V_{APC}$ drops (such as when the power amplifier turns off), the detector detects the falling edge of $V_{APC}$ and trips the comparitor 112. The output of the comparitor 112 is connected to a timer 108. In the example shown in FIG. 7, the timer 108 is a 1-shot timer. When the comparitor 112 is tripped, a pulse is sent to the 1-shot timer 108, which turns the timer 108 on for a duration $T_D$, chosen to be approximately equal to the switching time of the power amplifier 100. The timer 108 is connected to the bias control circuit, which includes switching device M2. The output of the timer 108 causes the switching device M2 to be turned on during $T_D$ (the power amplifier switching time). The switching device M2 is connected to a first current source 114, formed by switching devices M3 and M4 (which is shown connected to a DC current source or a source proportional to the degree of saturation of switching device M1). Another current source 116 is formed by switching devices M5 and M6, which is also connected to switching device M2. The current source 114 supplies the desired bias current to the current source 116 while switching device M2 is turned on by the timer 108. The bias current supplied to the op-amp 104 by the current source 116 then supplies bias current to the op-amp 104 during the duration $T_D$.

Figure 8:
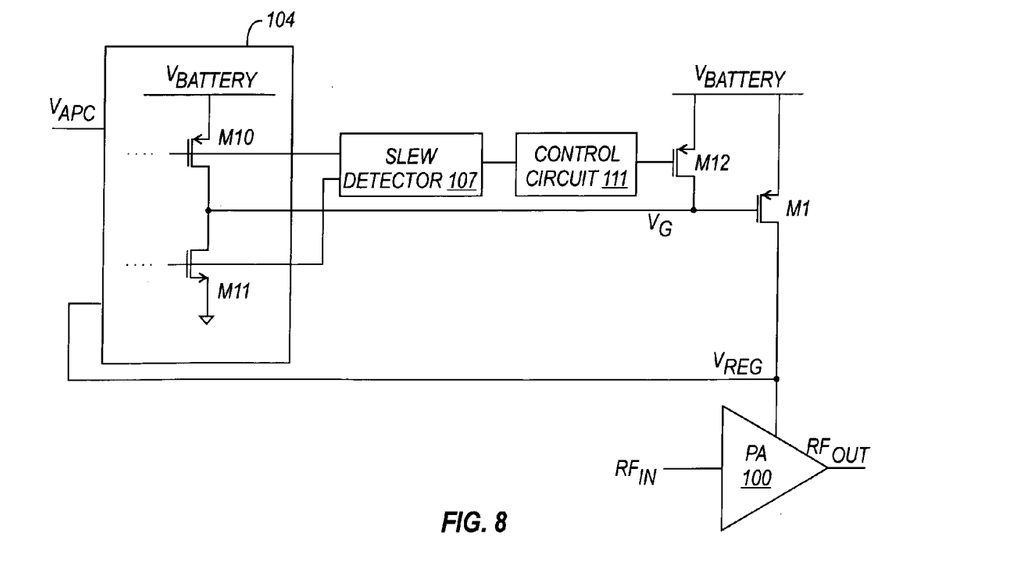
FIG. 8 is a schematic diagram of another example of a power amplifier having a dynamically biased voltage regulator.

FIG. 8 is a block diagram of another example of a power amplifier having a dynamically biased voltage regulator. In FIG. 8, an op-amp 104 is shown, including the output stage of the op-amp 104. The output stage of the op-amp 104 includes switching devices M10 and M11 coupled between a voltage supply $V_{BATTERY}$ and ground. A slew detector 107 is connected to the switching devices M10 and M11 to detect when the output stage of the op-amp 104 is slewing by detecting when $I_{10} > k \cdot I_{20}$, where $I_{10}$ and $I_{20}$ are the currents through the switching devices M10 and M11, respectively, and k is a constant. When the slew detector 107 detects that the op-amp 104 is slewing $V_G$ higher to recover from a saturated condition (e.g., op-amp 104 is saturated), it is desired to quickly increase $V_G$ in order to begin lowering $V_{REG}$. For the duration that the slew detector 107 detects this condition, the control circuit 111 turns on switching device M12, which quickly raises the voltage $V_G$.

Figure 9:
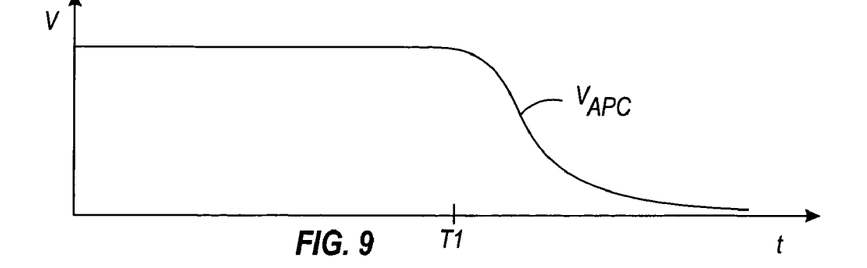
FIGS. 9–12 are timing diagrams illustrating the operation of the circuit shown in FIG. 7.
Figure 10:
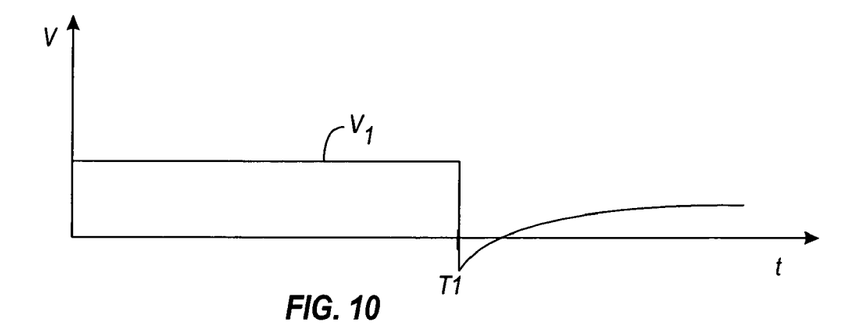
Figure 11:
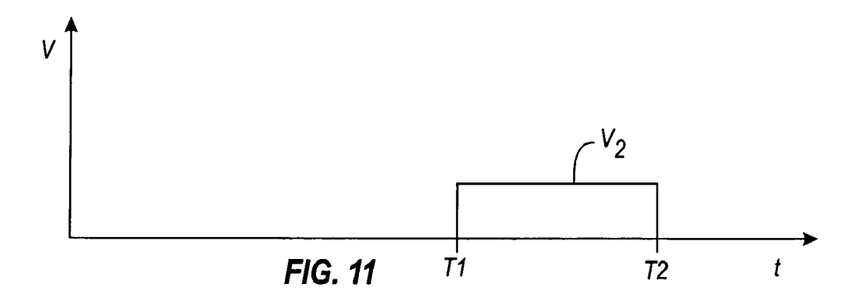
Figure 12:
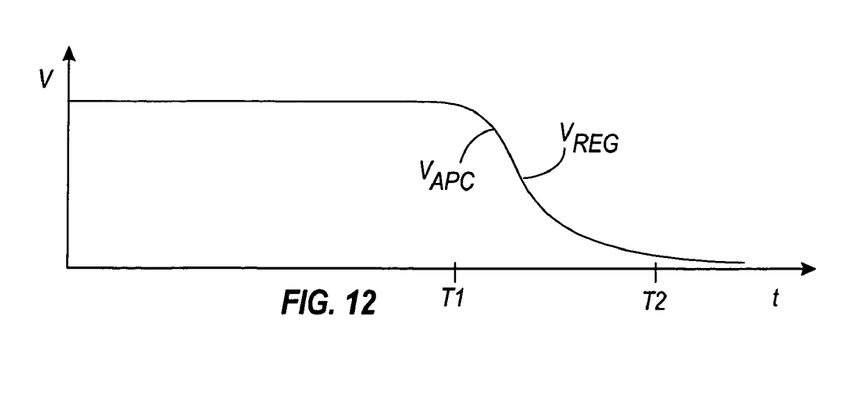

FIGS. 9–12 are timing diagrams illustrating the operation of the circuit shown in FIG. 7. FIG. 9 is a diagram showing the amplifier control signal $V_{APC}$ versus time. The waveform shown in FIG. 9 is representative of when the power amplifier 100 switches off at time T1. As the voltage of the power control signal $V_{APC}$ begins to drop at time T1, the detector detects the falling edge of $V_{APC}$. FIG. 10 is a diagram of the voltage $V_1$ present at the node connecting the capacitor C2, resistor R2, and comparitor 112 (FIG. 7). When the control signal $V_{APC}$ drops at T1, the voltage $V_1$ drops down, and slowly rises again (depending on the time constant selected). When $V_1$ drops at time T1, the comparitor 112 is tripped. When the comparitor 112 is tripped, the 1-shot timer 108 is activated. FIG. 11 is a diagram of the output $V_2$ of the timer 108. In this example, the output V2 is high from T1 to T2, which corresponds to a duration chosen to approximate $T_D$, the switching time of the power amplifier. From T1 to T2, the output of the timer 108 turns on switching device M2, which connects the current source 114 to the current source 116, which provides bias current to the op-amp 104. When the bias current is provided to the op-amp 104, the op-amp goes to a high gain state, which overcomes the problems described above. FIG. 12 is a diagram illustrating $V_{REG}$ with the bias current applied during T1 to T2. As shown, $V_{REG}$ is equal to $V_{APC}$.

Figure 13:
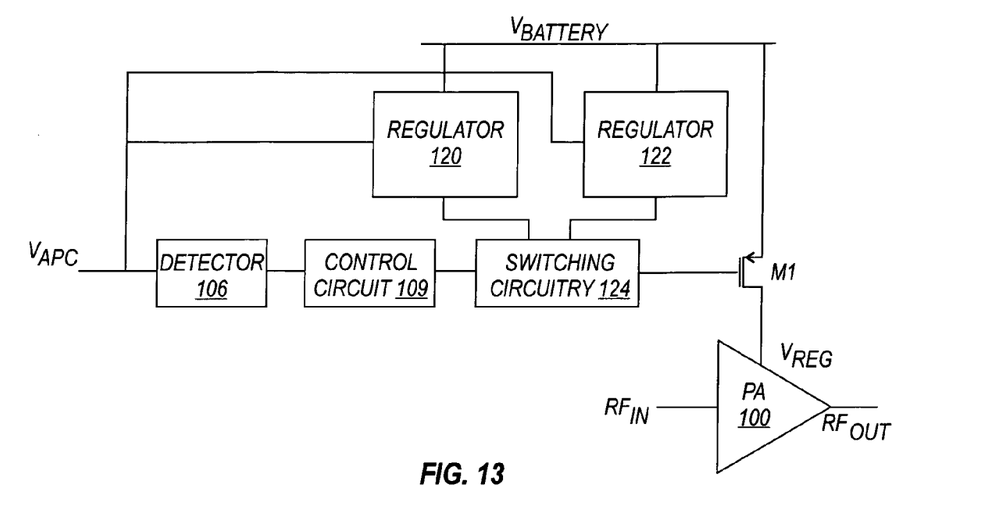
FIG. 13 is a block diagram of another example of the invention.

FIG. 13 is a block diagram of another example of the present invention. FIG. 13 shows a power amplifier 100, a detector 106, control circuitry 109, and switching circuitry 124. Rather than a single regulator, FIG. 13 shows first and second regulators 120 and 122 coupled between a voltage source $V_{BATTERY}$ and the switching circuitry 124. The output of the switching circuitry 124 is coupled to the gate of the switching device M1, which is coupled between $V_{BATTERY}$ and the power amplifier 100. When the detector 106 detects one or more conditions, the control circuitry 109 is triggered. In one example, during normal operation, the regulator 120 supplies power to the power amplifier 100 via switching circuitry 124 and switching device M1. When the control circuitry 109 is triggered, the switching circuitry 124 causes the second regulator 122 to decrease the settling time of the power supplied through switching device M1. Note that any desired number of regulators may be used. The regulators 120 may be comprised of any desired combination of voltage and/or current regulators. For example, the regulators 120 and 122 may each be voltage or current regulators. In another example, one regulator may be a voltage regulator and the other a current regulator.

Figure 14:
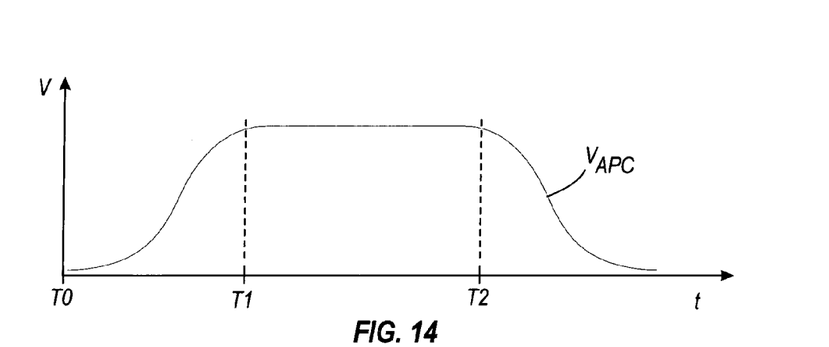
FIG. 14 is a timing diagram of an amplifier power control signal.

In the examples above where a condition is detected based on the waveform of the amplifier control signal $V_{APC}$, the bias control circuit or switching circuitry can be triggered in alternate ways. FIG. 14 is a timing diagram showing a control signal $V_{APC}$ corresponding to a power amplifier turning on at T1 and turning off at T2. If the goal is to apply bias current while a power amplifier turns off (at T2), then T2 can be detected directly (described above) or indirectly. For example, the detector can detect T2 by detecting T1 and adding a delay to T1. Similarly, the detector can detect T2 by detecting T0 and adding a delay to T0. The delay circuitry may be incorporated in the timer.

The present invention has several advantages over the prior art. First, no headroom is required on the regulating switching device M1, so the power amplifier circuit can be designed for lower supply voltages. Second, for devices operating with a battery supply, long battery life is preserved by increasing the current to the power regulator, or by using the current to turn on another op-amp, for a very low duty cycle. Another advantage is that switching transients are suppressed by the invention.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit for regulating the output power of a power amplifier during a switching transient comprising:
    a regulator for providing regulated power to the power amplifier;
    a detector circuit coupled to the regulator and to a control signal that is generated to control the output power of the power amplifier, wherein the detector circuit detects switching transients of the power amplifier; and
    a bias control circuit coupled to the regulator for applying a bias signal to the regulator to decrease the settling time of the regulator during the detected switching transients, wherein the regulator continues to provide regulated power to the power amplifier while the bias signal is applied.

2. The circuit of claim 1, further comprising a timer circuit coupled to the bias control circuit and the detector circuit for controlling when the bias signal is applied to the regulator.

3. The circuit of claim 1, wherein the detector detects when a voltage level of the control signal drops.

4. The circuit of claim 1, wherein the bias control circuit decreases the settling time of the regulator by applying a bias current to the regulator.

5. The circuit of claim 1, wherein the bias control circuit decreases the settling time of the regulator by applying a bias voltage to the regulator.

6. The circuit of claim 1, further comprising a switching device coupled to the detector, wherein the bias control circuit decreases the settling time of the regulator by turning on the switching device in response to a detected condition.

7. A circuit for regulating the output power of a power amplifier during a switching transient comprising:
    a regulator for providing regulated power to the power amplifier;
    a detector for detecting a condition relating to the operation of the regulator; and
    control circuitry coupled to the regulator for applying a bias signal to the regulator to decrease the settling time of the regulator in response to the detected condition, wherein the regulator continues to provide regulated power to the power amplifier while the condition is detected.

8. The circuit of claim 7, further comprising a timer coupled to the detector and the control circuitry for controlling the duration that the control circuitry controls the output power of the regulator in response to the detected condition.

9. The circuit of claim 8, further comprising delay circuitry for delaying when the control circuitry controls the output power of the regulator in response to the detected condition.

10. The circuit of claim 7, wherein the output level of the regulator is controlled by a power control signal, and wherein the detector detects a condition relating to the power control signal.

11. The circuit of claim 10, wherein the detector detects when the power control signal level drops.

12. The circuit of claim 7, wherein the control circuitry varies the speed at which the regulator is able to respond to the detected condition.

13. The circuit of claim 12, wherein the regulator is dynamically biased in response to a detected condition.

14. The circuit of claim 7, wherein the control circuitry changes the way the regulator controls the output power of the power amplifier in response to a detected condition.

15. The circuit of claim 14, further comprising switching circuitry for selectively activating two or more regulators in response to the detected condition.

16. The circuit of claim 7, wherein the regulator is a voltage regulator.

17. The circuit of claim 7, wherein the regulator is a current regulator.

18. A method of controlling a regulator for providing regulated power to a power amplifier, the method comprising:
 using the regulator to regulate the power provided to the power amplifier;
 detecting a condition relating to the operation of the regulator; and
 in response to a detected condition, applying a bias signal to the regulator for a limited duration to decrease the settling time of the regulator while continuing to provide regulated power to the power amplifier.

19. The method of claim 18, wherein the regulator is a voltage regulator.

20. The method of claim 19, wherein the bias signal is a bias voltage.

21. The method of claim 18, wherein the regulator is a current regulator.

22. The method of claim 21, wherein the bias signal is a bias current.

* * * * *

UNITED STATES PATENT AND TRADEMARK OFFICE
CERTIFICATE OF CORRECTION

PATENT NO. : 7,173,491 B2  
APPLICATION NO. : 10/814617  
DATED : February 6, 2007  
INVENTOR(S) : Ryan M. Bocock et al.

Page 1 of 1

It is certified that error appears in the above-identified patent and that said Letters Patent is hereby corrected as shown below:

On the Title Page, Item [54] and in the Specification, column 1, Title:
DELETE "FAST SETTLING POWER AMPLIFIER REGULATOR"
ADD --DYNAMICALLY BIASED REGULATOR--

Signed and Sealed this
Nineteenth Day of August, 2014

Michelle K. Lee
*Deputy Director of the United States Patent and Trademark Office*